(12) United States Patent
Shoji et al.

(10) Patent No.: US 8,661,659 B2
(45) Date of Patent: Mar. 4, 2014

(54) METHOD OF PRODUCING CIRCUIT BOARD

(75) Inventors: Takashi Shoji, Kawasaki (JP);
Takekazu Sakai, Yokohama (JP)

(73) Assignee: Showa Denko K.K., Tokyo (JP)

( * ) Notice: Subject to any disclaimer, the term of this patent is extended or adjusted under 35 U.S.C. 154(b) by 145 days.

(21) Appl. No.: 13/266,379

(22) PCT Filed: Apr. 12, 2010

(86) PCT No.: PCT/JP2010/002648
§ 371 (c)(1),
(2), (4) Date: Oct. 26, 2011

(87) PCT Pub. No.: WO2010/125753
PCT Pub. Date: Nov. 4, 2010

(65) Prior Publication Data
US 2012/0042511 A1 Feb. 23, 2012

(30) Foreign Application Priority Data

Apr. 30, 2009 (JP) ................................. 2009-111591

(51) Int. Cl.
*H05K 3/36* (2006.01)
(52) U.S. Cl.
USPC ............... 29/830; 29/846; 29/847; 29/829; 156/275.5
(58) Field of Classification Search
USPC ............ 29/829–830, 840–847; 174/260–262, 174/255; 228/56.3, 246; 156/275.2–275.5
See application file for complete search history.

(56) References Cited

U.S. PATENT DOCUMENTS

| 5,417,771 A * | 5/1995 | Arita et al. ....................... 148/23 |
| 6,095,400 A * | 8/2000 | Liu .............................. 228/56.3 |
| 2005/0133572 A1* | 6/2005 | Brese et al. .............. 228/180.22 |
| 2012/0042515 A1* | 2/2012 | Shoji et al. ....................... 29/841 |

FOREIGN PATENT DOCUMENTS

| JP | 07-007244 A | 1/1995 |
| JP | 7-30243 A | 1/1995 |

(Continued)

OTHER PUBLICATIONS

Taiwanese Office Action dated Jan. 29, 2013, issued in corresponding Taiwan Patent Application No. 099112322.

(Continued)

*Primary Examiner* — Minh Trinh
(74) *Attorney, Agent, or Firm* — Sughrue Mion, PLLC

(57) ABSTRACT

Provided is a method of producing a circuit board that can stably provide normal circuit boards by preventing the solder detachment and the generation of needle-like crystals during the formation of solder bumps. The method of producing a circuit board includes steps of forming an adhesive layer by applying an adhesiveness-imparting compound to the surface of a terminal of the circuit board; attaching solder particles onto the adhesive layer; applying an activator that includes a hydrohalic acid salt of an organic base to the solder particles and fixing the solder particles by heating the circuit board to which the solder particles have been attached at a temperature equal to or lower than the melting point of the solder; applying a flux to the circuit board to which the solder particles have been fixed; and melting the solder particles by heating the circuit board.

5 Claims, 2 Drawing Sheets

(56) References Cited

FOREIGN PATENT DOCUMENTS

| JP | 2004-282062 A | | 10/2004 |
|---|---|---|---|
| JP | 2004282062 A | * | 10/2004 |
| JP | 2008-041803 A | | 2/2008 |
| JP | 2008-041867 A | | 2/2008 |
| JP | 2008041803 A | * | 2/2008 |
| JP | 2008041867 A | * | 2/2008 |
| TW | 200833450 | | 8/2008 |

OTHER PUBLICATIONS

International Search Report of PCT/JP2010/002648 dated May 18, 2010.

* cited by examiner

METHOD OF PRODUCING CIRCUIT BOARD

CROSS REFERENCE TO RELATED APPLICATIONS

This application is a National Stage of International Application No. PCT/JP2010/002648 filed Apr. 12, 2010, claiming priority based on Japanese Patent Application No. 2009-111591 filed Apr. 30, 2009 the contents of all of which are incorporated herein by reference in their entirety.

TECHNICAL FIELD

The present invention relates to a method of producing a circuit board.

Priority is claimed on Japanese Patent Application No. 2009-111591, filed on Apr. 30, 2009, the content of which is incorporated herein by reference.

BACKGROUND ART

In recent years, means for configuring an electronic circuit by forming a circuit pattern on a plastic board, a ceramic board, or an insulating board coated with plastic or the like, and bonding electronic components such as IC elements, semiconductor chips, resists, and condensers onto the circuit pattern by soldering has been widely used.

In this case, in order to bond a lead terminal of the electronic component to a predetermined portion of the circuit pattern, generally, a thin solder layer is formed in advance on the surface of a conductive circuit electrode on the board, a solder paste or a flux is printed on the thin solder layer, predetermined electronic components are loaded so as to be positioned, and then the thin solder layer or the thin solder layer and the solder paste are caused to reflow to melt and solidify the solder, whereby the lead terminal is bonded by soldering.

In recent years, in order to miniaturize electronic products, the circuit board has been required to have a fine pitch, and for example, fine pitch components such as a QFP (Quad Flat Package) with a pitch of 0.3 mm, a CSP (Chip Size Package), an FC (Flip Chip) with a pitch of 0.15 mm, and an LSI chip having a BGA structure are widely mounted on the circuit board. In order to mount these chips on the circuit board, solder bumps formed in the chip or the like and solder bumps formed in the circuit board are superimposed on each other, and the solder bumps are caused to reflow to each other, whereby both the bumps are melted and bonded. Accordingly, in the circuit board, solder bumps protruding from the circuit board surface need to be formed, and the solder bumps are required to have a fine pattern shape that can respond to the fine pitch.

As means for forming the solder bumps in a circuit board, there is electroplating, non-electrolytic plating, or a method of printing a paste of solder particles and causing the paste to reflow, for example. However, in a method of producing the solder bump by the non-electrolytic plating, it is difficult to make the solder layer thick, and in a method of producing the solder bump by the electroplating, it is difficult to apply electric currents for plating to a complex circuit. Moreover, in a method implemented by printing the paste of solder particles, it is difficult to respond to the fine chip pattern.

As a method of forming a circuit board of a fine pitch, there is a disclosure of a method (see PTL 1). In this method, an adhesive layer is formed by allowing an adhesiveness-imparting compound to react with the surface of a terminal portion of the circuit board, solder particles are attached to the adhesive layer, and then the circuit board is heated to melt the solder particles, whereby solder bumps are formed.

In addition, a technique of covering a circuit electrode portion with a resist to make uniform the height of solder bumps, providing opening portions in the circuit electrode portion, and attaching only one solder particle to each opening portion has been developed (see PTL 2).

Furthermore, a method of using solder particles which are processed into a predetermined shape to improve the adhesiveness of the solder particles has been developed (see PTL 3).

CITATION LIST

Patent Literature

[PTL 1] JP-A-7-7244
[PTL 2] JP-A-2008-41803
[PTL 3] JP-A-2008-41867

SUMMARY OF INVENTION

Technical Problem

However, the production of the circuit board using the above methods has a problem. To explain, if the solder particles are not firmly attached to the terminal portion during a fixing step, the solder particles are detached in a reflow step for forming a circuit pattern due to the melting of the solder particles. Consequently, a normal solder pattern fails to be formed, and the yield of the product decreases. The larger the solder particles used, the more easily the problem occurs.

When the fixing temperature is set to be higher than the melting point so as to promote the fixing of the solder particles to the terminal portion of the circuit board, there is also a problem in that disconnection occurs due to the formation of needle-like crystals on the surface of the solder particles, and the circuit board becomes defective. Particularly, this problem markedly occurs when large solder particles that can form the solder bump by being attached one by one to the terminal portion are used.

The present invention has been made in consideration of the above-described situation, and an object thereof is to provide a method of producing a circuit board that can stably provide normal circuit boards by preventing the solder detachment and generation of needle-like crystals during the formation of the solder bump.

Solution to Problem

In order to solve the above problems, the present inventor made a thorough investigation. As a result, the inventor clarified that an oxide film on the surface of the solder particles inhibits the solder particles from being fixed to the terminal portion of the circuit board and becomes a cause of the solder bump detachment in the reflow step. Accordingly the inventor found that the solder bump detachment in the reflow step can be prevented by removing the oxide film of the surface of the solder particles before the reflow step, thereby completing the present invention.

That is, the present invention is:

[1] A method of producing a circuit board including: forming an adhesive layer by applying an adhesiveness-imparting compound to the surface of a terminal of the circuit board; attaching solder particles onto the adhesive layer; applying an activator that includes a hydrohalic acid salt of an organic base to the solder particles and fixing the solder particles by heating the circuit board to which the solder particles have been attached at a temperature equal to or lower than the melting point of the solder; applying a flux to the circuit board to which the solder particles have been fixed; and melting the solder particles by heating the circuit board.

[2] The method of producing a circuit board according to [1], wherein the activator is a hydrobromic acid salt of an organic base.

[3] The method of producing a circuit board according to [1] or [2], wherein the activator is a liquid obtained by dissolving the hydrohalic acid salt of the organic acid base in a solvent.

[4] The method of producing a circuit board according to any one of [1] to [3], wherein the liquid dissolving the hydrohalic acid salt of the organic base is an organic solvent including isopropyl alcohol and ethyl alcohol.

[5] The method of producing a circuit board according to any one of [1] to [4], wherein the adhesiveness-imparting compound includes one or more kinds of materials selected from the group consisting of a naphthotriazole-based derivative, a benzotriazole-based derivative, an imidazole-based derivative, a benzimidazole-based derivative, a mercaptobenzothiazole-based derivative, and benzothiazolethio fatty acid.

Advantageous Effects of Invention

In the method of producing a circuit board of the invention, an activator is applied to solder particles before the fixing of the solder particles. Accordingly, it is possible to remove the oxide film on the surface of the solder particles without deteriorating the adhesive layer as in a case where a flux is applied before fixing. As a result, there is no concern that the solder particles will be detached from the terminal portion before fixing, and the defect of the solder bump caused in the reflow step can be prevented. Moreover, since the oxide film on the surface of the solder particles is removed by the activator, it is possible to reliably fix the solder particles even at a temperature equal to or lower than the melting point of the solder. Consequently, it is possible to prevent the abnormal growth of the needle-like crystals, and there is no concern regarding the hindrance of the mounting of electronic components.

As described above, according to the present invention, it is possible to stably produce a circuit board without deteriorating the yield of the product. As a result, it is possible to provide an electronic instrument having a high degree of integration and a high reliability.

DESCRIPTION OF EMBODIMENTS

Figure 1:
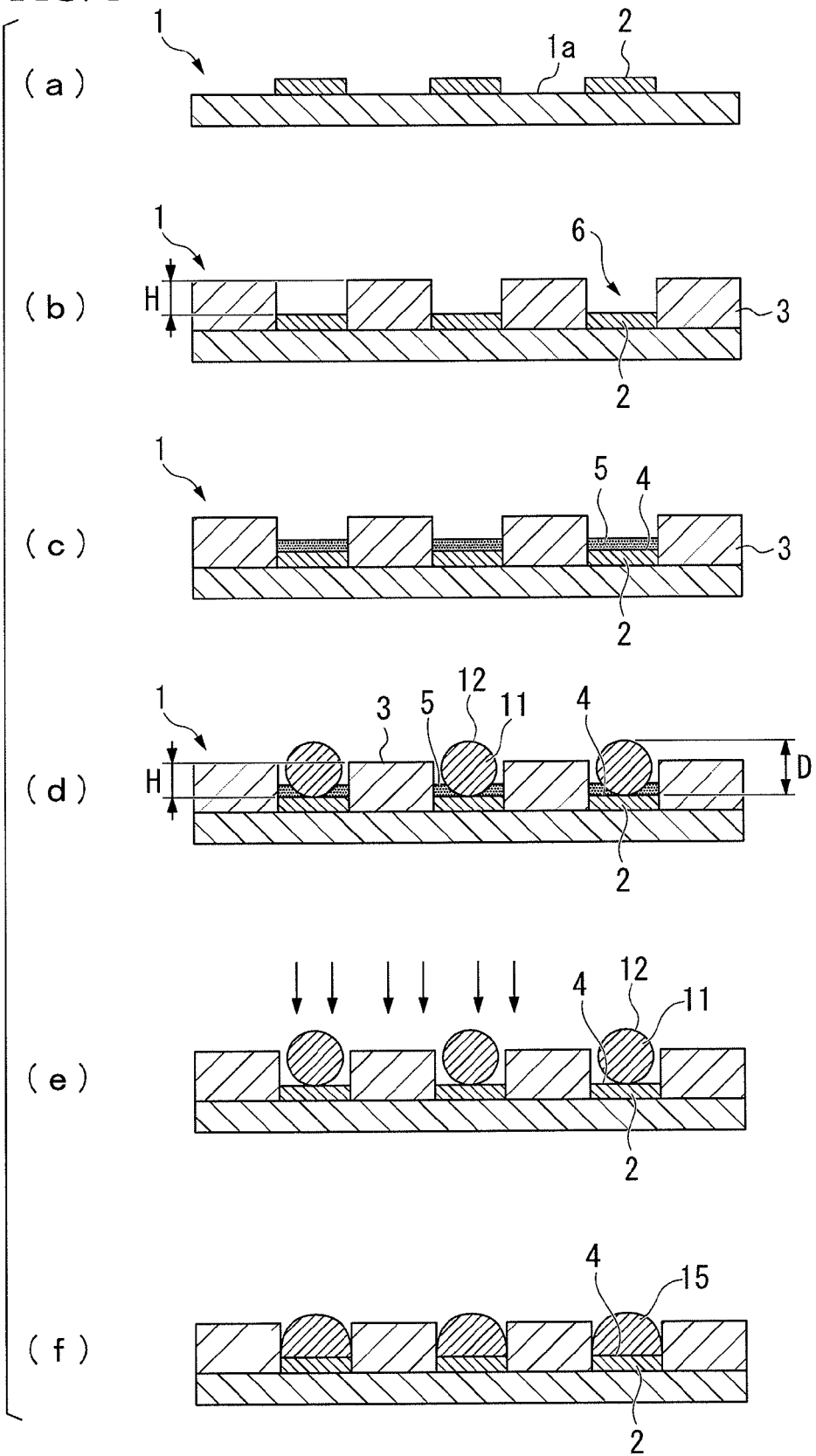
FIG. 1 is a process drawing illustrating a production process of a circuit board that is an embodiment of the present invention.
Figure 2:
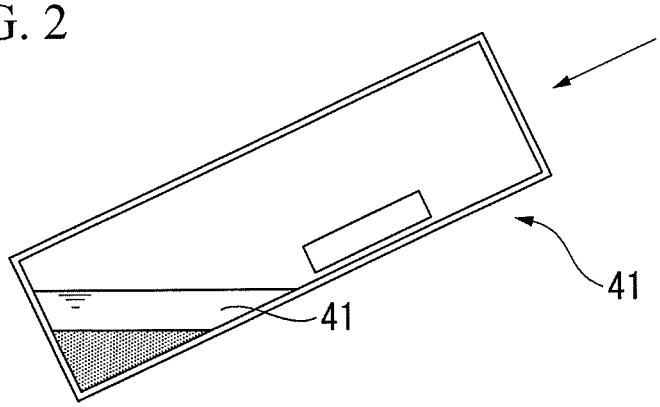
FIG. 2 is a schematic view illustrating a step of attaching solder particles.

Hereinafter, a method of producing a circuit board that is an embodiment of the present invention will be described with reference to drawings. FIG. 1 is a process drawing illustrating a method of producing a circuit board of the present embodiment, and FIG. 2 is a schematic view illustrating a step of attaching solder particles.

The method of producing a circuit board of the present embodiment is schematically configured of steps of forming an adhesive layer by applying an adhesiveness-imparting compound on the surface of a terminal of a circuit board, attaching solder particles onto the adhesive layer, applying an activator that includes a hydrohalic acid salt of the organic base to the circuit board to which the solder particles have been attached, fixing the solder particles by heating the circuit board to which the solder particles have been attached at a temperature equal to or lower than the melting point of the solder, applying a flux to the circuit board to which the solder particles have been fixed, and melting the solder by heating the circuit board to which the flux has been applied. Hereinafter, desirable embodiments of the respective steps will be described in detail.

A circuit board 1 as a subject of the invention is a board that is obtained by laminating a metal plate on a plastic board, a plastic film board, a glass fabric board, a paper-based epoxy resin board, a ceramics board, and the like, or a single-sided circuit board, a double-sided circuit board, a multilayered circuit board, or a flexible circuit board on which a circuit pattern is formed using a conductive material such as a metal on an insulating board that is obtained by covering a metal substrate with plastic, ceramics, and the like. In addition, the circuit board 1 can also be applied to an IC board, a condenser, a resist, a coil, a varistor, a bare chip, a wafer, and the like.

FIG. 1(a) is a cross-sectional view of the circuit board 1 used in the present embodiment. In an upper surface 1a of the circuit board 1 shown in FIG. 1(a), a circuit pattern formed of copper or a copper alloy is formed. In FIG. 1(a), a terminal portion 2 of the circuit pattern is shown. Hereinafter, a step of forming an adhesive layer 5 on a surface 4 of the terminal portion 2 will be described.

First, the periphery of the terminal portion 2 is surrounded by a resist (insulating layer) in advance, thereby forming an opening portion 6 shown in FIG. 1(b). Specifically, a resist layer 3 is formed on the entire upper surface 1a on the circuit board 1, followed by exposure and development, thereby providing the opening portion 6 for exposing the terminal portion 2 in the resist layer 3. The size of the opening portion 6 of the resist layer 3 is appropriately set according to a diameter D of solder particles 11 which will be attached in a later step. A depth H (a difference between the level of the surface of the terminal portion 2 and the level of the upper surface of the resist layer 3) of the opening portion 6 of the resist layer 3 is also appropriately set according to the diameter D of the solder particles 11 to be attached. It is desirable that the level difference H be in a range in which H is equal to or larger than a half of the diameter D of the solder particles 11 and is smaller than diameter D. Although it is desirable that the opening portion 6 have a circular shape, the opening portion 6 can have a square shape.

The resist layer 3 uses an insulating resist that is generally used for the production of a circuit board. For the resist layer 3, any resist can be used as long as the resist has a property of not expressing adhesiveness in a step of imparting the adhesive layer 5 to the surface 4 of the terminal portion 2 on the circuit board 1, which will be described later.

As a conductive material forming the terminal portion 2, copper or a copper alloy is used. However, the present invention is not limited thereto, and any conductive material can be used as long as the surface 4 of the terminal portion 2 can obtain adhesiveness for the material by an adhesiveness-imparting material described later. Examples of the conductive material include materials including Ni, Sn, Ni—Au, flash gold, Pd, an Ag solder alloy, and the like.

Next, as shown in FIG. 1(c), the adhesive layer 5 is formed on the surface 4 of the terminal portion 2. In order to form the adhesive layer 5, an adhesive solution is used which is obtained by dissolving at least one or two or more kinds of compounds among the adhesiveness-imparting compounds shown below in water or acidic water, and preferably adjusting the pH thereof to a slight acidity of about pH 3 to 4. By dipping the circuit board 1 in the adhesive solution, or by applying the adhesive solution to the circuit board 1, the adhesive layer 5 is formed on the surface 4 of the terminal portion 2, as shown in FIG. (c).

Examples of the adhesiveness-imparting compound include a naphthotriazole-based derivative, a benzotriazole-based derivative, an imidazole-based derivative, a benzimidazole-based derivative, a mercaptobenzothiazole-based derivative, a benzothiazolethio fatty acid, and the like. These adhesiveness-imparting compounds have a strong effect particularly on copper, but can also impart adhesiveness to other conductive materials.

The benzotriazole-based derivative that is suitably used in the present invention is represented by General Formula (1).

[Chem. 1]

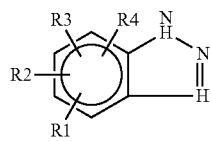

(1)

Here, in Formula (1), R1 to R4 are independently a hydrogen atom, an alkyl group with 1 to 16 (preferably 5 to 16) carbon atoms, an alkoxy group, F, Br, Cl, I, a cyano group, an amino group, or an OH group.

The naphthotriazole-based derivative that is suitably used in the present invention is represented by General Formula (2).

[Chem. 2]

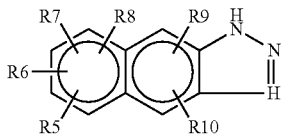

(2)

Here, in Formula (2), R5 to R10 are independently a hydrogen atom, an alkyl group with 1 to 16 (preferably 5 to 16) carbon atoms, an alkoxy group, F, Br, Cl, I, a cyano group, an amino group, or an OH group.

The imidazole-based derivative that is suitably used in the present invention is represented by General Formula (3).

[Chem. 3]

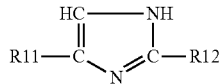

(3)

Here, in Formula (3), R11 and R12 are independently a hydrogen atom, an alkyl group with 1 to 16 (preferably 5 to 16) carbon atoms, an alkoxy group, F, Br, Cl, I, a cyano group, an amino group, or an OH group.

The benzimidazole-based derivative that is suitably used in the present invention is represented by General Formula (4).

[Chem. 4]

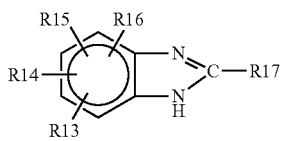

(4)

Here, in Formula (4), R13 to R17 are independently a hydrogen atom, an alkyl group with 1 to 16 (preferably 5 to 16) carbon atoms, an alkoxy group, F, Br, Cl, I, a cyano group, an amino group, or an OH group.

The mercaptobenzothiazole-based derivative that is suitably used in the present invention is represented by General Formula (5).

[Chem. 5]

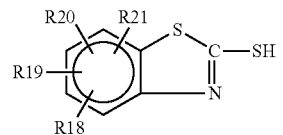

(5)

Here, in Formula (5), R18 to R21 are independently a hydrogen atom, an alkyl group with 1 to 16 (preferably 5 to 16) carbon atoms, an alkoxy group, F, Br, Cl, I, a cyano group, an amino group, or an OH group.

The benzothiazolethio fatty acid that is suitably used in the present invention is represented by General Formula (6).

[Chem. 6]

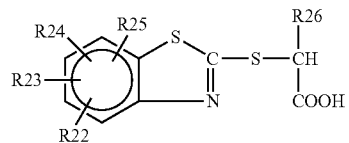

(6)

Here, in Formula (6), R22 to R26 are independently a hydrogen atom, an alkyl group with 1 to 16 (preferably 1 or 2) carbon atoms, an alkoxy group, F, Br, Cl, I, a cyano group, an amino group, or an OH group.

Among these compounds, in the benzotriazole-based derivative represented by General Formula (1), the more carbon atoms included in R1 to R4, the stronger the adhesiveness is in general.

In addition, in the imidazole-based derivative and the benzimidazole-based derivative that are represented by General Formulae (3) and (4) respectively, the more carbon atoms, the stronger the adhesiveness is in general.

In the benzothiazolethio fatty acid derivative that is represented by General Formula (6), R22 to R26 preferably include 1 or 2 carbon atoms.

Examples of a material used for adjusting the pH of the adhesive solution include inorganic acids such as hydrochloric acid, sulfuric acid, nitric acid, and phosphoric acid. In addition, as organic acids, formic acid, lactic acid, acetic acid, propionic acid, malic acid, oxalic acid, malonic acid, succinic acid, and tartaric acid can be used.

There is no limitation on the concentration of the adhesiveness-imparting compound in the adhesive solution, and the concentration may be appropriately adjusted for use according to the solubility and the usage situation. The concentration is preferably in a range of 0.05% by mass to 20% by mass as a whole. If the concentration is lower than this range, sufficient adhesiveness cannot be imparted, which is thus not preferable.

The treatment temperature at the time when the adhesive solution is attached to the terminal portion 2 is preferably slightly higher than room temperature. In this manner, the formation rate of the adhesive layer 5 and the amount of the adhesive layer 5 formed become excellent. The treatment temperature varies depending on the concentration of the adhesiveness-imparting compound and the type of the metal configuring the terminal portion 2, but is preferably in a range from 30° C. to 60° C. in general. It is preferable to adjust other conditions so that the dipping time is in a range from 5 seconds to 5 minutes.

It is preferable that 50 ppm to 1000 ppm of copper be also present as ions in the adhesive solution, since the formation efficiency such as the formation rate of the adhesive layer 5 and the amount of adhesive layer 5 formed is heightened.

The formation method of the adhesive layer 5 of the present embodiment can be effectively used as means for forming not only the terminal portion 2 of the circuit board 1 but also the solder bump portion for bonding LSI itself, that is, the bump of an LSI chip including BGA, CSP (chip size package) LSI, and the like. In addition, these components are naturally included in the circuit board 1 of the present invention.

Next, as shown in FIG. 1(d), the solder particles 11 are attached onto the terminal portion 2 through the adhesive layer 5, in the air, in an inert gas atmosphere, or in a liquid. The method thereof will be described hereinafter.

As a method of attaching the solder particles 11 to the adhesive layer 5, there is a method of directly supplying the solder particles 11 to the adhesive layer 5 and bringing the solder particles 11 into contact with the adhesive layer 5 in the air or in an inert atmosphere, and a method of dispersing the solder particles 11 in a dispersion 41 to create a slurry-like state and supplying and attaching the slurry to the adhesive layer 5, for example.

First, in order to attach the solder particles 11 to the adhesive layer 5 in the air or in an inert gas atmosphere, the solder particles 11 are introduced to a container filled with air or inert gas, the circuit board 1 in which the adhesive layer 5 has been formed is installed in the container, and the container is tilted or vibrated, thereby attaching the solder particles 11 to the adhesive layer 5.

In order to attach the solder particles 11 in a liquid, for example, as shown in FIG. 2, the dispersion 41 such as water is introduced to a container 40, and the solder particles 11 are added to the dispersion 41 such as water. Thereafter, the circuit board 1 is installed in the container 40, and the container 40 is tilted as shown in FIG. 2. In this manner, the solder particles 11 are added to the adhesive layer 5 of the circuit board 1, in the dispersion 41.

When the solder particles 11 are attached in a liquid, it is possible to prevent the solder particles 11 from being attached to a non-adhesive portion or from aggregating due to static electricity. Accordingly, attaching the solder particles 11 in a liquid is suitable when a circuit board with high pitch and fine powder are used. These methods of attaching the solder particles 11 can be appropriately selected and used according to the size of the solder particlse 11 or the like.

The solder particles 11 are rendered to have the height of a bump 15. Therefore, it is desirable that one solder particle 11 be attached to one opening portion 6.

To do this, the diameter D of the solder particles 11 is appropriately set according to the size of the opening portion 6.

Examples of a metal composition of the solder particles 11 include compositions based on Sn—Pb, Sn—Pb—Ag, Sn—Pb—Bi, Sn—Pb—Bi—Ag, and Sn—Pb—Cd. From the recent viewpoint of the exclusion of Pb in regard to industrial waste, compositions based on Sn—In, Sn—Bi, In—Ag, In—Bi, Sn—Zn, Sn—Ag, Sn—Cu, Sn—Sb, Sn—Au, Sn—Bi—Ag—Cu, Sn—Ge, Sn—Bi—Cu, Sn—Cu—Sb—Ag, Sn—Ag—Zn, Sn—Cu—Ag, Sn—Bi—Sb, Sn—Bi—Sb—Zn, Sn—Bi—Cu—Zn, Sn—Ag—Sb, Sn—Ag—Sb—Zn, Sn—Ag—Cu—Zn, and Sn—Zn—Bi, which do not include Pb, are preferable.

Examples of the above metal compositions include, based on a eutectic solder (hereinafter, represented as 63 Sn/37 Pb) including 63% by mass of Sn and 37% by mass of Pb, 62 Sn/36 Pb/2 Ag, 62.6 Sn/37 Pb/0.4 Ag, 60 Sn/40 Pb, 50 Sn/50 Pb, 30 Sn/70 Pb, 25 Sn/75 Pb, 10 Sn/88 Pb/2 Ag, 46 Sn/8 Bi/46 Pb, 57 Sn/3 Bi/40 Pb, 42 Sn/42 Pb/14 Bi/2 Ag, 45 Sn/40 Pb/15 Bi, 50 Sn/32 Pb/18 Cd, 48 Sn/52 In, 43 Sn/57 Bi, 97 In/3 Ag, 58 Sn/42 In, 95 In/5 Bi, 60 Sn/40 Bi, 91 Sn/9 Zn, 96.5 Sn/3.5 Ag, 99.3 Sn/0.7 Cu, 95 Sn/5 Sb, 20 Sn/80 Au, 90 Sn/10 Ag, 90 Sn/7.5 Bi/2 Ag/0.5 Cu, 97 Sn/3 Cu, 99 Sn/1 Ge, 92 Sn/7.5 Bi/0.5 Cu, 97 Sn/2 Cu/0.8 Sb/0.2 Ag, 95.5 Sn/3.5 Ag/1 Zn, 95.5 Sn/4 Cu/0.5 Ag, 52 Sn/45 Bi/3 Sb, 51 Sn/45 Bi/3 Sb/1 Zn, 85 Sn/10 Bi/5 Sb, 84 Sn/10 Bi/5 Sb/1 Zn, 88.2 Sn/10 Bi/0.8 Cu/1 Zn, 89 Sn/4 Ag/7 Sb, 88 Sn/4 Ag/7 Sb/1 Zn, 98 Sn/1 Ag/1 Sb, 97 Sn/1 Ag/1 Sb/1 Zn, 91.2 Sn/2 Ag/0.8 Cu/6 Zn, 89 Sn/8 Zn/3 Bi, 86 Sn/8 Zn/6 Bi, 89.1 Sn/2 Ag/0.9 Cu/8 Zn, and the like. As the solder particle 11 used in the present invention, 2 or more kinds of solder particles having different compositions may be used in combination.

Next, as shown in FIG. 1(e), the activator including a hydrohalic acid salt of an organic base is applied to the circuit board 1 to which the solder particles 11 have been attached, followed by drying, and fixed by heating.

In the present embodiment, in order to remove the oxide film of a surface 12 of the solder particles 11, a treatment is performed using the activator before the fixing step. At this time, if the adhesive layer 5 attached to the terminal portion 2 of the circuit board 1 deteriorates due to the activator, the solder particles 11 are easily detached. Accordingly, the activator solution needs to be rapidly solidified after application. Therefore, it is desirable that the activator solution not include a high boiling point compound. This is because, unlike the flux described later which includes a high boiling point compound to heighten a washing property of the flux after melting of the solder and is used without being dried after the application, the activator before the fixing step is used by being dried after the application. By performing fixing after the application and drying of the activator, it is possible to remove the oxide film of the surface 12 of the solder particles 11, without deteriorating the adhesive layer 5. As a result, there is no concern that the bonding between the solder particles 11 and the terminal portion 2 will be inhibited during fixing, and it is possible to fix the solder particles at a temperature equal to lower than the melting point of the solder. The method thereof will be described hereinafter.

The application of the activator including a hydrohalic acid salt of an organic base to the circuit board 1 to which the solder particles 11 have been attached can be performed by spraying the activator solution to the surface of the circuit board 1 by using a spray device. The circuit board 1 to which the activator has been applied is dried at room temperature in the air.

The hydrohalic acid salt of the organic base included in the activator is desirably a hydrobromic acid salt compound, since bromine has an excellent ability of removing the oxide film of the surface 12 of the solder particles 11. Specifically, ethylamine.HBr, isopropylamine.HBr, diphenylguanidine-.HBr, and the like can be used.

These hydrohalic acid salts of the organic base are dissolved in an organic solvent, thereby being used as the activator solution. As the organic solvent, isopropyl alcohol, ethyl alcohol, and the like can be used. The concentration of the hydrohalic acid salt of the organic base in the activator solution is desirably 0.5 wt % or higher, which is equal to or lower than a saturated concentration, and more desirably in a range from 0.1% to 4.0%. This is because if the concentration of the activator is high, the adhesive layer 5 deteriorates, and if the concentration is low, the oxide film of the surface 12 of the solder particles 11 is insufficiently removed.

Next, the circuit board 1 to which the activator has been applied is heated, and the oxide film of the surface 12 of the solder particles 11 is allowed to react with the components of the activator, thereby removing the oxide film of the surface 12 of the solder particles 11.

In addition, by heating of the circuit board 1, a reaction in which the constituent material of the terminal portion 2 is diffused toward the solder particle 11 side is caused between the terminal portion 2 and the solder particles 11, and the solder particles 11 are fixed while maintaining their shape. Provided that a melting point of the solder is M, the fixing temperature is preferably in a range from (M-50)° C. to (M-0)° C., and more preferably in a range from (M-30)° C. to (M-5)° C. After fixing, the circuit board 1 is cooled to room temperature.

The fixing step can be performed using the same device as the device used in the reflow step of a general solder. In addition, as the atmospheric gas used in the fixing step, air or an inert gas can be used.

Thereafter, the reflow step shown in FIG. 1(*f*) is performed, thereby forming a solder bump 15. The method thereof will be described hereinafter.

The flux is applied to the circuit board 1 to which the solder particles 11 have been fixed. The flux is used for the purpose of removing the oxide film on the surface 12 of the solder particles 11 and on the surface 4 of the terminal portion 2 and improving the melting property. As the flux used at this time, a flux having a higher activity than that of the activator may be used. Since the solder particles have already been fixed to the terminal portion 2, it is not necessary to actively leave the adhesive layer 5 at this stage. When the solder particles 11 are caused to reflow, the surplus adhesive layer 5 instead hinders the reflow. Accordingly, as the flux, it is preferable to use the following.

The flux is obtained by adding water or a water-soluble organic solvent to flux components. The flux components include an inorganic acid salt of an amine or an amino acid (for example, hydrochloric acid salt of dimethylamine or glutamic acid and hydrobromic acid salt of pyridine); an organic acid salt of an amine or an amino acid (for example, an oxalic acid salt of glutamic acid and a succinic acid salt of dimethylamine); organic acid (for example, glycolic acid, lactic acid, malic acid, formic acid, acetic acid, oxalic acid, malonic acid, and succinic acid); inorganic acid (for example, hydrofluoric acid, hydrochloric acid, hydrobromic acid, hydriodic acid, fluoroboric acid, phosphoric acid, zinc chloride, ammonium chloride, sodium chloride, stannous chloride, stannous fluorochloride, and sodium fluoride), and the like. Among these, it is particularly preferable to use an inorganic acid salt of an amine or an amino acid and an organic acid salt of an amine or an amino acid. Moreover, as the water-soluble organic solvent, it is possible to use solvents obtained by adding glycerin, polyethylene, polypropylene, and phenyl ether to alcohols with 1 to 3 carbon atoms or to high boiling point alcohol ethers.

The flux includes water or a water-soluble organic solvent preferably in a range from 30 parts to 100 parts by mass, and more preferably 50 parts to 90 parts by mass, based on 10 parts by mass of the flux components. If the amount of the water-soluble organic solvent added is larger than 100 parts by mass, the effect of the flux at the time of reflow is reduced, and if the added amount is smaller than 30 parts by mass, the amount of the reflux remaining after the reflow increases.

A surfactant is mixed with the flux in order to secure application uniformity of the flux so as to prevent application omission from occurring in the fixing portion of the solder particles 11 and to heighten the removal rate of the flux residue after the reflow. Although commercially available products can be used as the surfactant, it is particularly preferable to use nonionic surfactants, and for example, it is preferable to use polyoxyethylene alkyl ether, polyoxyethylene secondary alcohol ether, polyoxyethylene alkylphenyl ether, polyoxyethylene sterol ether, a polyoxyethylene lanolin derivative, a polyoxyethylene polyoxypropylene block copolymer, and polyoxyethylene polyoxypropylene alkyl ether.

The amount of the surfactant added to the flux is preferably in a range from 5 parts to 20 parts by mass, and more preferably in a range from 8 parts by mass to 15 parts by mass, per 10 parts by mass of the surfactant. If the amount of the surfactant added is larger than 20 parts by mass, the effect of the flux is reduced, and if the added amount is smaller than 5 parts by mass, the effect obtained by the addition of the surfactant becomes insufficient.

It is preferable to further add glycol to the surfactant-mixed flux for improving a washing property. The glycol includes ethylene glycol, propylene glycol, polyethylene glycol, polypropylene glycol, and the like. In the present invention, it is particularly preferable to use ethylene glycol or polyethylene glycol.

The amount of the glycol added to a flux composition is in a range from 10 parts by mass to 40 parts by mass, and preferably in a range from 15 parts by mass to 35 parts by mass, based on 100 parts by mass of the flux. If the amount of glycol added is larger than 40 parts by mass, the performance of the flux is reduced, and if the added amount is smaller than 10 pats by mass, the effect obtained by the addition of the glycol becomes insufficient, whereby the melting property of the solder particles 11 and the washing property of the flux worsen.

Next, the solder particles 11 are melted by the reflow step. The heating temperature varies depending on the type of the solder used, but in a case of an Sn—Ag-based composition, the heating temperature is 220° C. to 250° C., and preferably 230° C. to 240° C. The reflow time is desirably 30 seconds to 60 seconds, at a temperature equal to or higher than the melting point. The reflow step may be performed in two steps of pre-heating and reflowing so as to stabilize the temperature. In this case, pre-heating is desirably performed at 130° C. to 180° C. for about 60 seconds to 120 seconds.

After the reflow step, the flux is washed with water and removed.

As described above, according to the method of producing the circuit board 1 of the present embodiment, even when the surface 12 of the solder particles 11 has been oxidized, it is possible to remove the oxide film of the surface 12 of the solder particles 11 by applying an activator as a fixing aid, in a state where the solder particles 11 have been attached to the adhesive layer 5. As a result, it is possible to fix the solder particles 11 by allowing the solder particles 11 to reliably react with the surface 4 of the terminal portion 2 in the fixing step. Moreover, by removing the oxide film of the surface 12 of the solder particles 11 and performing fixing, it is possible to solve the problem in that the solder particles 11 are detached after the reflow which is the next step. In this manner, it is possible to stably produce the circuit board 1 without decreasing the yield of the product. In addition, by applying the activator before the fixing step, it is possible to shorten the fixing time, which took about 20 to 30 minutes in the past, to about 3 to 5 minutes.

Furthermore, by applying the activator to the circuit board 1 before the fixing step, it is possible to perform the fixing at a temperature equal to or lower than the melting point of the solder. As a result, it is possible to bond the components to be mounted to the circuit board 1, without causing the needle-like crystals that are the cause of defects to be generated from the solder particles 11. Accordingly, it is possible to provide an electronic instrument having a high degree of integration and a high reliability.

Moreover, by using the activator that is obtained by dissolving a hydrohalic acid salt of an organic base in a solvent, it is possible to perform fixing since only the oxide film of the surface 12 of the solder particles 11 is removed without melting the adhesive layer 5. As a result, even large solder particles 11 can be reliably fixed.

EXAMPLE

Hereinafter, the present invention will be described based on examples, but the present invention is not limited thereto.

Example 1

The circuit board 1 in which a plurality of terminal portions 2 having a diameter of 80 μm are arranged on a matrix with a pitch of 180 μm was prepared. Copper was used for a conductive circuit that configures the terminal portions 2. Next, on the circuit board 1, a resist layer 3 having a thickness of 25 μm that included circular opening portions 6 having a diameter of 80 μm was formed using general photolithography, and the terminal portions 2 were exposed from the opening portions 6. Subsequently, as an adhesive solution including the adhesiveness-imparting compound, 2% by mass of an aqueous imidazole-based compound solution in which the alkyl group of R12 of General Formula (3) was $C_{11}H_{23}$ and R11 was a hydrogen atom was adjusted to about pH 4 by acetic acid. This adhesive solution was warmed to 40° C., and the circuit board 1 that had been pre-treated with an aqueous hydrochloric acid solution was dipped into the adhesive solution for 3 minutes, thereby forming the adhesive layer 5 on the surface 4 of the terminal portion 2.

Thereafter, a particle-attaching device that had internal dimensions of 200 mm×120 mm×150 mm and was provided with the container 40 having an input port for inputting the circuit board 1 in a horizontal direction was prepared. 1600 ml of water and about 400 g of the solder particles 11 that had a composition of 96.5 Sn/3.5 Ag and a particle size of 70 μm were put into the container 40. Subsequently, the particle-attaching device was tilted, and the circuit board 1 in which the adhesive layer 5 had been formed was input to the particle-attaching device, while the solder particles 11 were kept so as not to contact the circuit board 1. After the circuit board 1 was put into the particle-attaching device, the container was tilted to the left and right sides at 30° for 30 to 60 seconds, whereby the solder particles 11 were attached to the circuit board 1. The period of tilting was set to 10 sec/tilt. In this manner, one solder particle 11 was attached to one terminal portion 2 respectively.

Thereafter, the circuit board 1 was taken out of the particle-attaching device, followed by gentle washing with pure water, and then dried.

Subsequently, as an organic halide, ethylamine.HBr was dissolved in ethyl alcohol as an organic solvent, thereby preparing an activator made as a 1% ethanol solution. Thereafter, by using a spray device, the activator was sprayed and applied to the whole surface of the circuit board 1 to which the solder particles 11 had been attached. Then, the circuit board 1 to which the activator had been applied was dried in the air.

The circuit board 1 that had been dried in the air was put in an oven heated at 213° C., and heat fixing was performed for 3 minutes in the air. At this time, the heat fixing temperature was about 8° C. lower than 221° C., which is the melting point of the 96.5 Sn/3.5 Ag. After the heat fixing, the temperature was cooled to room temperature, and then the circuit board 1 was taken out.

Next, a flux having a composition including 10 parts by mass of dimethylamine.HBr, 80 parts by mass of isopropylamine, 14 parts by mass of polyoxyethylene alkyl ether, and 32 parts by mass of polyoxyethylene glycol was sprayed and applied to the circuit board 1.

The circuit board 1 to which the flux had been applied was input to a reflow furnace with a nitrogen atmosphere so as to be heated at 240° C. for 1 minute, and the solder particles 11 were melted, thereby forming the solder bumps 15. After the solder bumps 15 were formed, the circuit board 1 was taken out, and the formation of the solder bump 15 was checked. Detachment was not found among 100,000 solder bumps 15.

Example 2

The circuit board 1 of Example 2 was produced in the same manner as Example 1, except that after the solder particles 11 were attached and dried in the same manner as used in Example 1, isopropylamine.HBr was dissolved in isopropyl alcohol as an organic solvent to prepare an activator made as a 1% isopropyl alcohol solution as the activator.

After the solder bumps 15 were formed, the circuit board 1 was taken out, and the formation of the solder bump 15 was checked. Detachment was not found among 100,000 solder bumps 15.

Example 3

The circuit board 1 of Example 3 was produced in the same manner as Example 1, except that after the solder particles 11 were attached and dried in the same manner as used in Example 1, diphenylguanidine.HBr was dissolved in ethyl alcohol as an organic solvent to prepare an activator made as a 1% ethyl alcohol solution as the activator.

After the solder bumps 15 were formed, the circuit board 1 was taken out, and the formation of the solder bump 15 was checked. Detachment was not found among 100,000 solder bumps 15.

Comparative Example 1

The solder particles 11 were attached to the terminal portion 2 by using the particle-attaching device in the same manner as Example 1, and then the circuit board 1 was dried.

Thereafter, the fixing step was performed without the application of the activator. That is, the circuit board 1 having undergone drying was put in an oven heated at 213° C., and heat fixing was performed for 15 minutes in the air. At this time, the heat fixing temperature was about 8° C. lower than 221° C. which was the melting point of 96.5 Sn/3.5 Ag. After the heat fixing, the temperature was cooled to room temperature, and then the circuit board 1 was taken out.

Subsequently, the flux was sprayed and applied to the circuit board 1.

The circuit board 1 to which the flux had been applied was heated for 1 minute at 240° C. by a reflow furnace with a nitrogen atmosphere, and the solder particles 11 were melted, thereby forming the solder bumps 15. After the solder bumps 15 were formed, the circuit board 1 was taken out, and the formation of the solder bump 15 was checked. Among the total of 100,000 solder bumps 15 in 100 pieces of circuit boards, about 200 solder particles 11 were detached, and about 20% of the circuit board 1 was rejected.

Comparative Example 2

The circuit board 1 of Comparative Example 2 was produced in the same manner as Comparative Example 1, except that after the solder particles 11 were attached and dried in the same manner as used in Example 1, the heat fixing temperature in the oven was set to 230° C.

After the solder bumps 15 were formed, the circuit board 1 was taken out, and the formation of the solder bump 15 was checked. Needle-like crystals were found in about 50% of the solder bumps 15.

Industrial Applicability

In a method of producing a solder circuit board having a solder circuit, particularly, one having solder bumps, by imparting adhesiveness to the surface of a conductive circuit electrode on a circuit board, attaching solder particles to the adhesive portion, and melting the solder, there is a problem in that the solder particles are detached in a step of forming solder bumps by melting of the solder. This problem is solved by the present invention. As a result, it is possible to provide a method of producing a solder circuit board in which the solder bump is not damaged, with an excellent yield. Moreover, it is possible to provide an electronic instrument having a high degree of integration and a high reliability.

| Reference Signs List | |
|---|---|
| 1 | circuit board |
| 1a | upper surface of circuit board |
| 2 | terminal portion |
| 3 | resist layer |

| Reference Signs List | |
|---|---|
| 4 | surface of terminal portion |
| 5 | adhesive layer |
| 6 | opening portion |
| 11 | solder particle |
| 12 | surface of solder particle |
| 15 | solder bump |
| 40 | container |
| 41 | dispersion |

The invention claimed is:

1. A method of producing a circuit board comprising:
   forming an adhesive layer by applying an adhesiveness-imparting compound to the surface of a terminal of a circuit board;
   attaching solder particles onto the adhesive layer formed on the surface of the terminal;
   applying an activator that includes a hydrohalic acid salt of an organic base to the solder particles attached to the adhesive layer and subsequently fixing the solder particles by heating the circuit board to which the solder particles have been attached at a temperature equal to or lower than the melting point of the solder;
   applying a flux to the circuit board to which the solder particles have been fixed; and
   melting the solder particles by heating the circuit board to which the flux has been applied.

2. The method of producing a circuit board according to claim 1,
   wherein the activator is a hydrobromic acid salt of an organic base.

3. The method of producing a circuit board according to claim 1,
   wherein the activator is a liquid obtained by dissolving a hydrohalic acid salt of the organic base in a solvent.

4. The method of producing a circuit board according to claim 3,
   wherein the liquid dissolving the hydrohalic acid salt of the organic acid base is an organic solvent including isopropyl alcohol and ethyl alcohol.

5. The method of producing a circuit board according to claim 1,
   wherein the adhesiveness-imparting compound includes one or more kinds of materials selected from the group consisting of a naphthotriazole-based derivative, a benzotriazole-based derivative, an imidazole-based derivative, a benzimidazole-based derivative, a mercaptobenzothiazole-based derivative, and a benzothiazolethio fatty acid.

* * * * *